US012701672B2

(12) United States Patent
Nishi

(10) Patent No.: US 12,701,672 B2
(45) Date of Patent: Aug. 4, 2026

(54) ACTIVE CONDENSATION MANAGEMENT FOR SUB-AMBIENT COOLING DEVICE

(71) Applicant: Advanced Micro Devices, Inc., Santa Clara, CA (US)

(72) Inventor: Yoshifumi Nishi, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 153 days.

(21) Appl. No.: 18/621,352

(22) Filed: Mar. 29, 2024

(65) Prior Publication Data

US 2025/0311148 A1     Oct. 2, 2025

(51) Int. Cl.
*H05K 7/20* (2006.01)

(52) U.S. Cl.
CPC ..... *H05K 7/20254* (2013.01); *H05K 7/20772* (2013.01)

(58) Field of Classification Search
CPC ........... H05K 7/20254; H05K 7/20218; H05K 7/2029; H05K 7/20327; H05K 7/20509; H05K 7/2039; H05K 7/20636; H05K 7/20672; H05K 7/20772; H05K 7/20809; G06F 1/20
See application file for complete search history.

(56) References Cited

U.S. PATENT DOCUMENTS

| | | | | |
|---|---|---|---|---|
| 4,812,733 A | * | 3/1989 | Tobey | G06F 1/30 |
| | | | | 361/679.02 |
| 2008/0010998 A1 | * | 1/2008 | Ouyang | H10N 10/13 |
| | | | | 62/3.2 |
| 2019/0203983 A1 | * | 7/2019 | Jeon | F25B 21/02 |
| 2020/0363104 A1 | * | 11/2020 | MacDonald | G06F 1/20 |
| 2023/0083995 A1 | * | 3/2023 | Wang | G06F 1/20 |
| | | | | 361/679.47 |

* cited by examiner

*Primary Examiner* — Jacob R Crum
(74) *Attorney, Agent, or Firm* — Patterson + Sheridan, LLP

(57) ABSTRACT

Embodiments herein describe active condensation management for a sub-ambient cooling device. In an example, the sub-ambient cooling device includes first and second TEC systems arranged in a stacked configuration, where the first TEC system is positioned between an integrated circuit device and the second TEC system, an IC-facing surface of the second TEC system has features (e.g., channels and ribs) that control a location at which condensation occurs and that direct the condensation to a catch basin positioned within a gap between the TEC systems. The features may be designed to function in multiple orientations, which may be useful to permit a cooled device to operate upright or on its side. The sub-ambient cooling device may include an enclosure to define/restrict a volume of space to be dehumidified.

18 Claims, 8 Drawing Sheets

ACTIVE CONDENSATION MANAGEMENT FOR SUB-AMBIENT COOLING DEVICE

TECHNICAL FIELD

Examples of the present disclosure generally relate to cooling systems and, more particularly, to active condensation management for a sub-ambient cooling device.

BACKGROUND

An integrated circuit (IC) card may include a sub-ambient cooling device, such as thermo-electric cooler (TEC) that draws heat from an IC device based on the Peltier effect. Benefits of sub-ambient cooling devices, such as TECs, are numerous.

A challenge of sub-ambient cooling devices relates to condensation and dew points. The dew point of a given body of air is a temperature to which it must be cooled to become saturated with water vapor. The dew point depends on the pressure and water content of the air. When the air is cooled below the dew point, its moisture capacity is reduced, and airborne water vapor condenses into liquid water. In the case of a sub-ambient cooling device, if the temperature of a surface of the sub-ambient cooling device falls below the dew point, liquid water forms on the surface. If the sub-ambient cooling device is disposed over an integrated circuit (IC), the water may drip onto the IC, which may damage or destroy the IC.

SUMMARY

Techniques for active condensation management for a sub-ambient cooling device are described. One example is an environmental control system for an integrated circuit (IC) device that includes first and second thermo-electric cooler (TEC) systems arranged in a stacked configuration such that the first TEC system is positioned between the IC device and the second TEC system, where an IC-facing surface of the second TEC system has first, second, and third recessed channels, a wall between the first and second channels defines a first rib, and a wall between the first and third channel defines a second rib.

Another example described herein is a computing device that includes a circuit card and an environmental control system (ECS) disposed over an IC device of the circuit card, where the ECS includes first and second TEC systems arranged in a stacked configuration such that the first TEC system is positioned between the IC device and the second TEC system, an IC-facing surface of the second TEC system has first, second, and third recessed channels, a wall between the first and second channels defines a first rib, and a wall between the first and third channel defines a second rib.

Another example described herein is method that includes controlling a mode of an environmental control system (ECS) of a circuit card based on a power-consumption mode of an integrated circuit (IC) device of the circuit card, where the ECS includes first and second TEC systems arranged in a stacked configuration such that the first TEC system is positioned between the IC device and the second TEC system, and where the controlling includes operating the ECS in a cooling mode when the IC device operates in a first power-consumption mode, and operating the ECS in a dehumidifying mode when the IC device operates in a reduced-power consumption mode relative to the first power-consumption mode.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
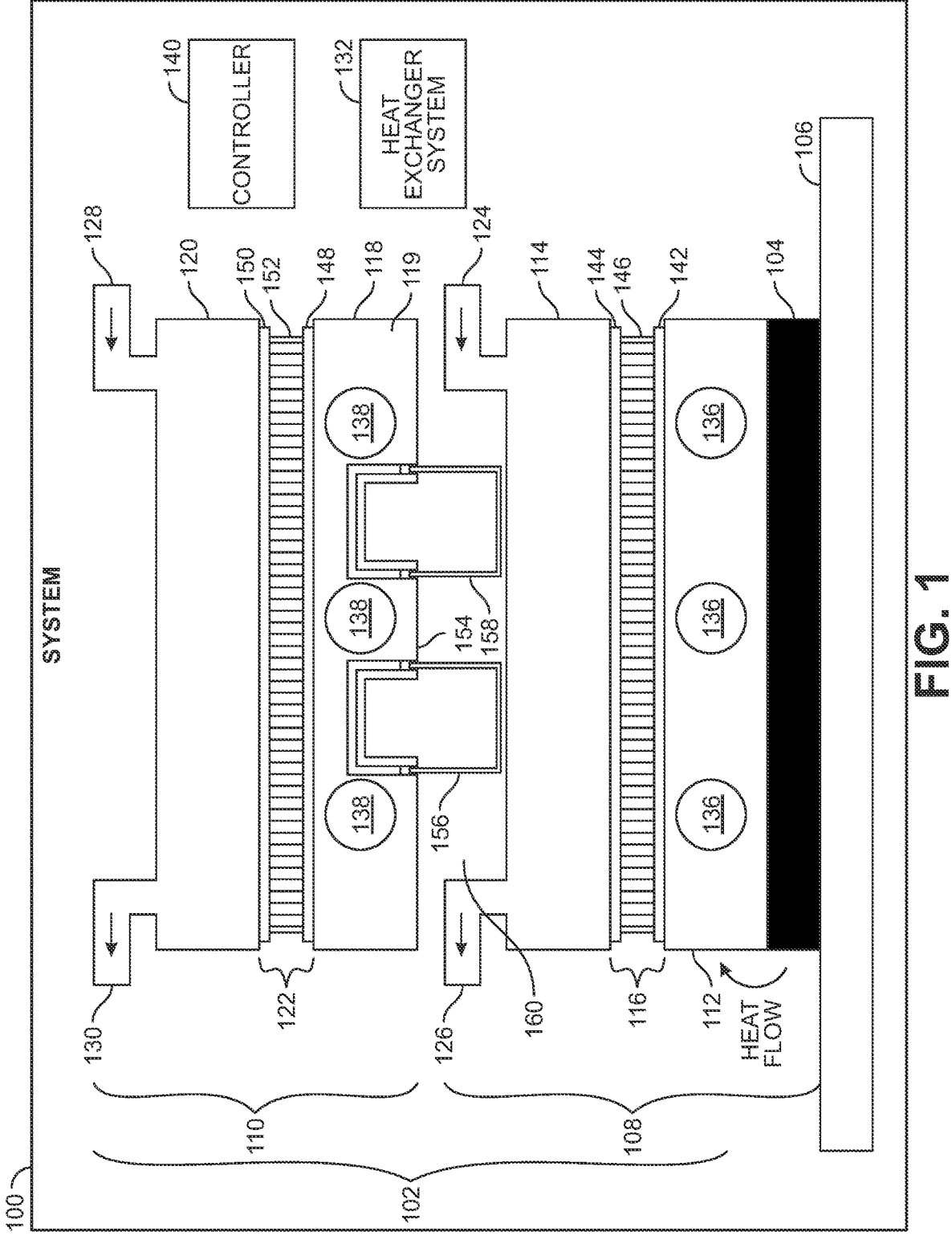
FIG. 1 illustrates a front-view of a system that includes an integrated circuit (IC) device and an environmental control system (ECS), according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe active condensation management for a sub-ambient cooling device.

Moisture condensation on a sub-ambient cooling device may be reduced by limiting cooling performance in order to maintain surfaces of the sub-ambient cooling device above the dew point. If the sub-ambient cooling device is used to cool an integrated circuit (IC), however, the reduced cooling performance may lead to an overheating condition in the IC. In a high-humidity environment, where the cooling performance may need to be reduced more significantly, the negative impact on the IC would be even more pronounced. Alternatively, the sub-ambient cooling device may be encased in a relatively thick layer of insulation to isolate the sub-ambient cooling device from ambient air. The insulation may, however, limit serviceability. Alternatively, an end-user could employ an external dehumidifier, but that may not be practical/possible for some end-users. Alternatively, a desiccant may be placed proximate to the sub-ambient cooling device. A desiccant may, however, provide limited efficacy.

Active condensation management for a sub-ambient cooling device, as disclosed herein, may be applied to a thermo-electric cooler (TEC) based system designed to cool an IC device. As an example, a sub-ambient cooling device may include multiple stacked TECs having a gap between adjacent TECs. An exposed IC-facing surface of one of the TECs (i.e., above the gap) includes features (e.g., channels and ribs/ridges) that control a location at which condensation occurs, and that that guide the condensation from the region to a catch basin via gravity. The features may be designed to function in multiple orientations, which may be useful to permit a cooled device (e.g., a desktop computer or circuit card) to operate in an upright position or turned on its side. A controller may switch TEC-based system from a full cooling mode to a dehumidifying mode in which the IC device operated in a low-stress (e.g., a reduced-power consumption) mode, and providing power only to the TEC(s) that have condensation stimulating features. The TEC-based system and the IC device may be enclosed within an enclosure to define a relatively small volume of space to be dehumidified.

Active condensation management for a sub-ambient cooling device may be useful for IC devices, such as, desktop processors and/or other devices.

Active condensation management for a sub-ambient cooling device may be useful in moderate and high-humidity environments.

Active condensation management for a sub-ambient cooling device may be employed with minimal cost/weight, and no added power consumption.

Active condensation management for a sub-ambient cooling device reduces relative humidity (RH), which may reduce long-term performance degradation.

FIG. 1 illustrates a front-view of a system 100, according to an embodiment. System 100 includes an environmental control system (ECS) 102 that cools an integrated circuit (IC) device 104 of an circuit card 106, and dehumidifies (i.e., captures water that condenses from) a local environment. IC device 104 may include, for example and without limitation, a central processing unit (CPU), a chip-set, and/or other IC device(s).

ECS 102 includes multiple thermo-electric cooler (TEC) systems, illustrated here as a lower TEC system 108 and an upper TEC system 110, arranged in a stacked configuration. In the example of FIG. 1, lower TEC system 108 includes a cold plate 112, a fluid container 114, and a TEC 116 positioned between cold plate 112 and fluid container 114. Upper TEC system 110 includes a cold plate 118, a fluid container 120, and a TEC 122 positioned between cold plate 118 and fluid container 120.

In FIG. 1, fluid container 114 has a fluid inlet 124 and a fluid outlet 126. Similarly, fluid container 120 has a fluid inlet 128 and a fluid outlet 130. In this example, ECS 102 may further include fluid outlet pipes that provide fluid outlet paths from fluid outlets 126 and 130 to a heat exchanger system 132, and fluid inlet pipes that return the fluid to fluid inlets 124 and 128. Heat exchanger system 132 may include one or more fluid pumps and/or one or more heat exchangers. The one or more heat exchangers may include a passive heat exchanger (e.g., radiating fins) and/or an active heat exchanger (e.g., a fan). In another example, heat exchanger system 132, fluid outlets 126 and 130, and fluid inlets 124 and 128 may be omitted.

Figure 2:
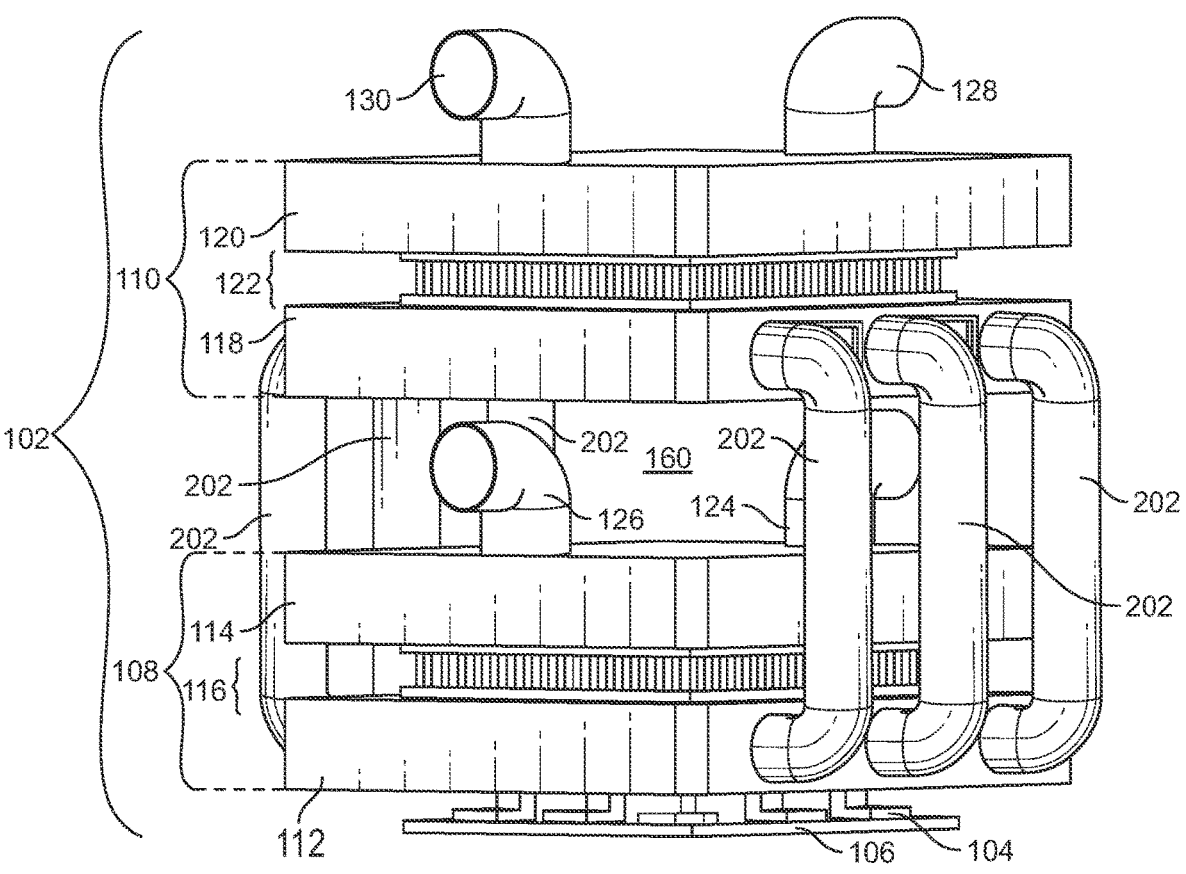
FIG. 2 illustrates a perspective view of the ECS, according to an embodiment.

Further in the example of FIG. 1, cold plate 112 has openings 136, and cold plate 118 has corresponding openings 138, that permit thermal load sharing between cold plates 112 and 118 (e.g., via heat pipes or fluid exchange). An example is provided below with reference to FIG. 2. FIG. 2 illustrates a perspective view of ECS system 102, according to an embodiment. In FIG. 2, ECS system 102 further includes heat pipes 202 that transfer heat from cold plate 112 to cold plate 118 via openings 136 and 138. In this example, cold plates 112 and 118 may be solid metal (e.g., copper), and ends of heat pipes 202 may be inserted into openings 136 and 138. Heat pipes 202 are passive heat transfer devices that transport thermal energy through capillary action from cold plate 112 to cold plate 118. In another example, cold plates 112 and 118 may contain fluid, and system 100 may further include a fluid pump that circulates the fluid between cold plates 112 and 118 via fluid pipes between pairs of openings 136 and 138. Cold plates 112 and 118 are not, however, limited to the foregoing examples.

ECS 102 draws heat from (i.e., cools) IC device 104 as described below. Dehumidification is described further below. Cold plate 112, and heat pipes 202, draws heat from IC device 104 via conduction and/or radiation (i.e., through a portion of cold plate 112 that is in contact or proximate to IC device 104). TEC 116 transfers heat from cold plate 112 to fluid container 114. Specifically, a first plate 142 (i.e., a cold side) of TEC 116 draws heat from cold plate 112. An array of semiconductor pillars 146 (e.g., arranged in rows of alternating p-type and n-type pillars) transfers heat from first plate 142 to a second plate 144 (i.e., a hot side) via the Peltier effect, as is well known. Fluid container 114 draws heat from second plate 144 via conduction. From fluid container 114, heat may be transferred directly to the surrounding environment via radiation, and/or via fluid flow through heat exchanger system 132.

Heat from cold plate 112 is also transferred to cold plate 118 of upper TEC system 110 via heat pipes 202. TEC 122 transfers heat from cold plate 118 to fluid container 120. Specifically, a first plate 148 (i.e., a cold side) of TEC 122 draws heat from cold plate 118. An array of semiconductor pillars 152 transfers heat from first plate 148 to a second plate 150 (i.e., a hot side) via the Peltier effect. Fluid container 120 draws heat from second plate 150 via conduction. From fluid container 120, heat may be transferred directly to the surrounding environment via radiation, and/or via fluid flow through heat exchanger system 132.

Dehumidification is described below. In the example of FIG. 1, water may condense on cold plates 112 and 118 near TEC 146 and 122. The proximity of cold plate 112 to IC device 104 may render it difficult to capture water that condenses on cold plate 112. Whereas a gap 160 between lower TEC system 108 and upper TEC system 110 may be advantageous for capturing water that condenses on the IC-facing side of cold plate 118. As described below, IC-facing surface 154 may be configured (e.g., contoured) to control locations at which water condenses, and to direct the condensation to one or more catch basins, illustrated in FIG. 1 as catch basins 156 and 158.

Figure 3:
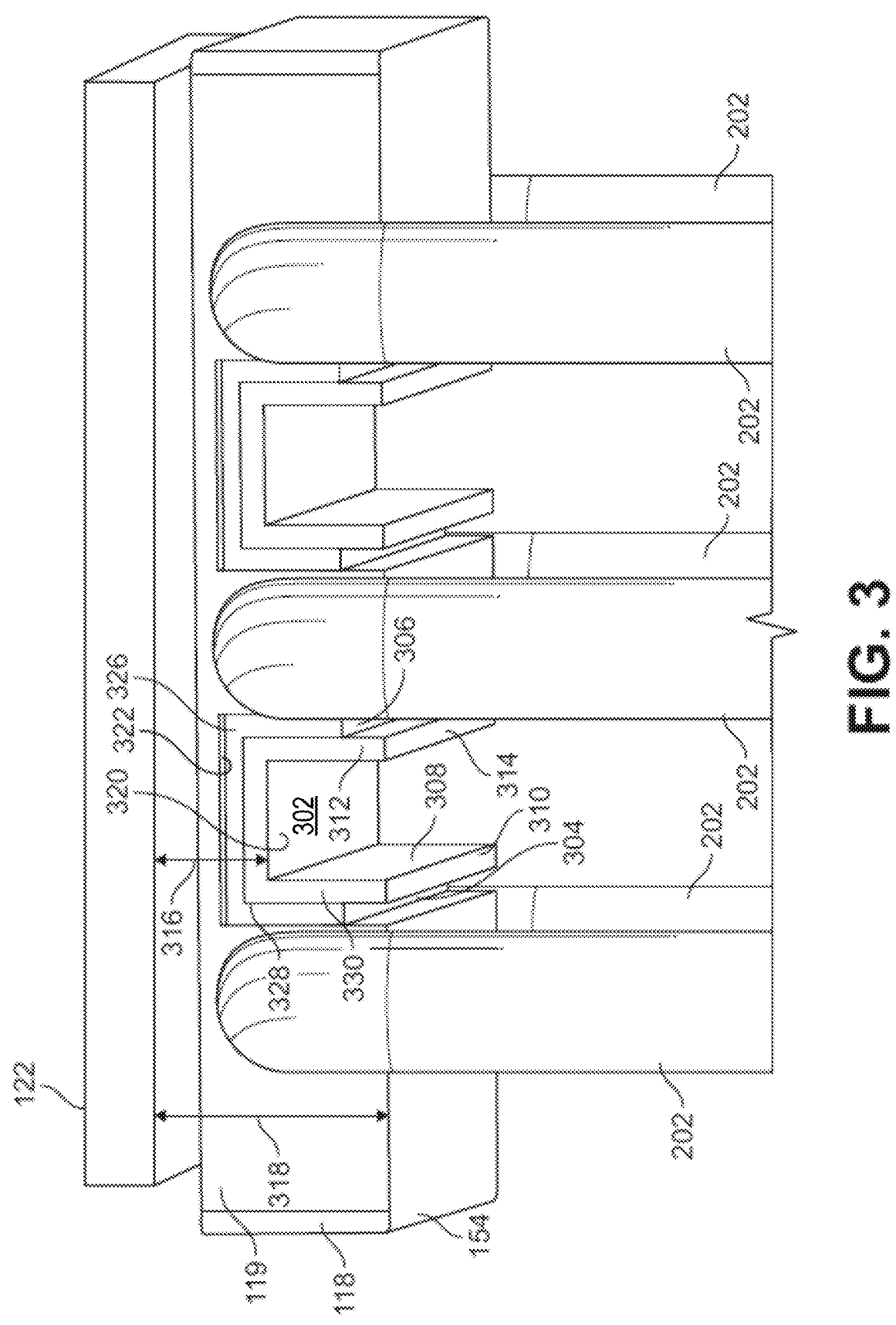
FIG. 3 illustrates a perspective under-side view of a cold plate of the ECS, according to an embodiment.

FIG. 3 illustrates a perspective under-side view of cold plate 118, according to an embodiment. In FIG. 3, IC-facing surface 154 (i.e., facing towards IC device 104) has first, second, and third recessed channels 302, 304, and 306, respectively. First recessed channel 302 is parallel to and positioned between second and third recessed channels 304 and 306. A wall 308 between first and second recessed channels 302 and 304 defines a first rib 310. A wall 312 between first and third recessed channels 302 and 306 defines a second rib 314.

In the example of FIG. 3, recessed channels 302, 304, and 306 are illustrated as having flat surfaces that intersect at right angles. In other examples, surfaces of recessed channels 302, 304, and 306 intersect in a more-rounded fashion (e.g., due to fabrication limitations and/or by design). In an example, one or more of recessed channels 302, 304, and 306 is defined by a single continuous, curved surface, which may have an elongated semi-cylindrical or tubular contour.

In FIG. 3, a distance 316 between a surface 320 of first recessed channel 302 and TEC 122 is less than a distance 318 between IC-facing surface 154 and TEC 122. In other words, surface 320 is closer to TEC 122. As a result, when TEC 122 is operating, surface 320 is cooler than IC-facing surface 154. The lower temperature of surface 320 stimulates/encourages moisture to condense on surface 320 rather than IC-facing surface 154. When IC-facing surface 154 is oriented substantially horizontally, gravity draws the water droplets toward ribs 310 and 314, and causes the droplets to fall from ribs 310 and 314, into a catch basin 156 (FIG. 1). Second and third recessed channels 304 and 306 preclude water droplets from flowing from first and second ribs 310 and 314 to IC-facing surface 154, when IC-facing surface 154 is oriented horizontally.

ECS 102 may be configured to capture condensation in one or more other orientations, which may be useful if system 100 is turned on its side. An example is provided below for a situation in which system 100 is tilted forward (i.e., an upper portion of system 100 is pulled away from the page toward the reader), such that IC-facing surface 154 and recessed channels 302, 304, and 306 are oriented substantially vertically, and a front surface 119 of cold plate 118 is oriented substantially horizontally.

In FIG. 3, first recessed channel 302 extends to an opening 322 in front surface 119 of cold plate 118. Front surface 119 has a fourth recessed channel 326 that surrounds opening 322. Fourth recessed channel 326 has a contour of opening 322. A wall between fourth recessed channel 326 and opening 322 defines a third rib 330. When IC-facing surface 154 and first recessed channel 302 are oriented substantially vertically, gravity draws water droplets within first recessed channel 302 toward rib 330, and causes the droplets to fall from rib 330 into catch basin 156 (FIG. 1). Fourth recessed channel 326 precludes water droplets from flowing from rib 330 to front surface 119 (i.e., when IC-facing surface 154 is oriented horizontally). In the example of FIG. 3, walls 308 and 312 merge with wall 328 at respective ends of wall 328. ECS 102 may include one or more additional sets of recessed channels, openings, and ribs to capture condensation for other orientations of ECS 102.

ECS 102 may be operable in multiple modes. In a first mode (i.e., a full operating mode), a controller 140 enables (e.g., provide power to) TECs 116 and 122, and to heat exchanger system 132 if applicable. Controller 140 may operate ECS 102 in the first mode when IC device 104 is operational. In a second mode, controller 140 may disable TEC 116 and enable TEC 122, and may enable heat exchanger system 132 if applicable. Disabling TEC 116 may preclude or substantially reduce condensation on the cold plate 112. To prevent overheating IC device 104 in the second mode, controller 140 may operate ECS in the second mode when IC device 104 operates in a reduced-power consumption state (e.g., a sleep state or a partial sleep state), such that IC device 104 generates sufficient heat to provide a temperature difference between surface 320 and IC-facing surface 154, without overheating IC device 104. ECS 102 may capture condensed water during the first and second modes. The second mode may be useful to capture additional condensed water (e.g., water that might otherwise have condensed on cold plate 112.

Figure 4A:
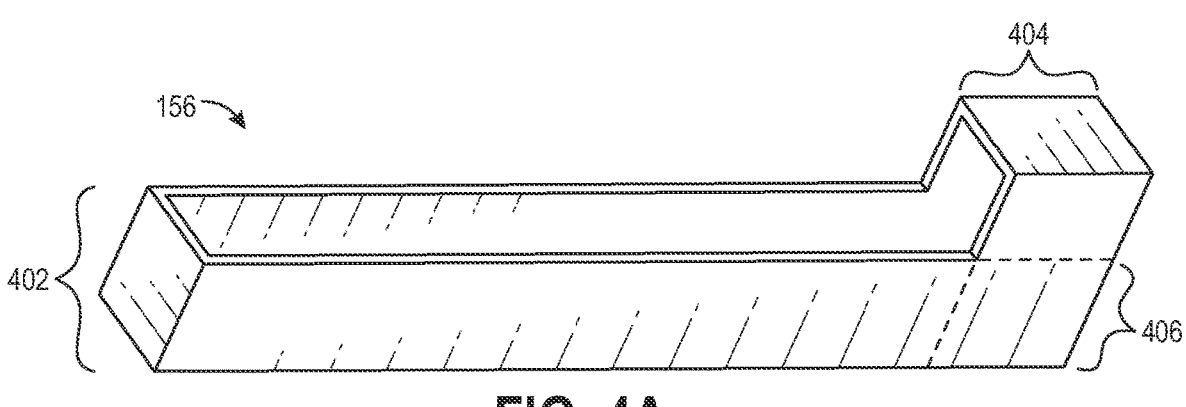
FIG. 4A illustrates a catch basin of the ECS, in a horizontal orientation, according to an embodiment.
Figure 4B:
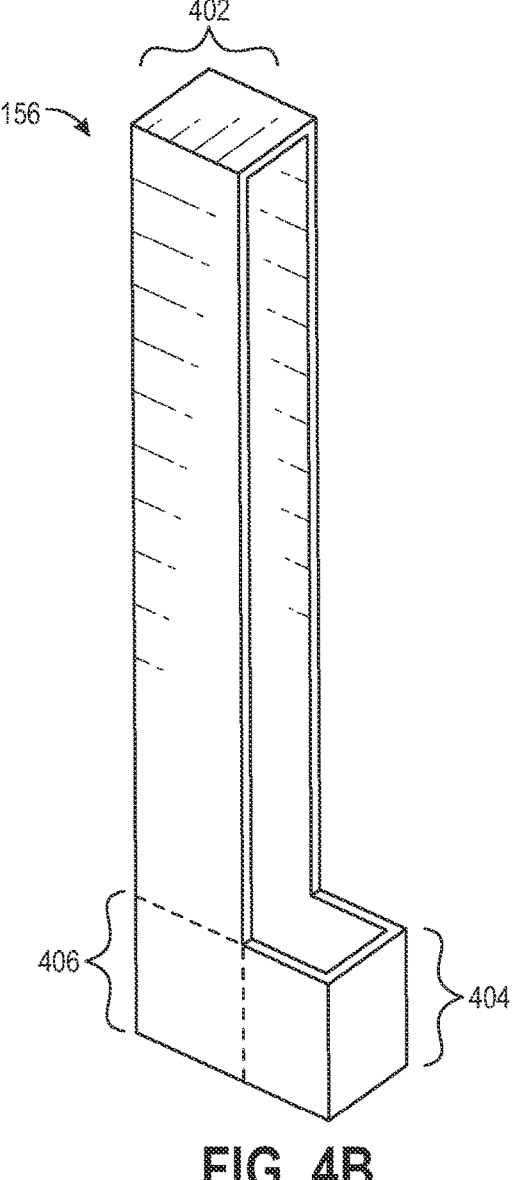
FIG. 4B illustrates the catch basin in a vertical orientation, according to an embodiment.

Catch basin 156 and/or catch basin 158 may be configured as described below with reference to FIGS. 4A and 4B. FIG. 4A illustrates catch basin 156 in a horizontal orientation, according to an embodiment. The horizontal orientation of FIG. 4A corresponds to a situation in which IC-facing surface 154 of cold plate 118 is oriented horizontally. FIG. 4B illustrates catch basin 156 in a vertical orientation, according to an embodiment. The horizontal orientation of FIG. 4A corresponds to a situation in which IC-facing surface 154 and recessed channels 302, 304, and 306 are oriented vertically.

In FIG. 4A, a first portion 402 of catch basin 156 holds water droplets from ribs 310 and 314, when IC-facing surface 154 of cold plate 118 is oriented horizontally. In FIG. 4B, a second portion 404 of catch basin 156 holds water droplets from ribs 310 and 314, when IC-facing surface 154 and recessed channels 302, 304, and 306 are oriented vertically. Volumes of portions 402 and 404 may be equal to one another, or may differ from one another. In an example, and without limitation, In the examples of FIGS. 4A and 4B, a portion 406 of catch basin 156 is common to first and second portions 402 and 404.

Catch basins 156 and 158 may be fixedly attached to ECS 102, or may be removable (e.g., to permit a user to empty water from the catch basins). In a relatively moderate humidity environment, the volume of catch basin 156 may be sufficient to hold water that condenses on surface 320. In such situations, water captured in catch basin 156 may evaporate when IC device 104 is operating (i.e., due to heat generated by IC device 104, by other IC devices of circuit card 106, and/or by other devices of system 100), in a repeating cycle of evaporation/dehumidification. In such situations, there may be no need for a user to empty the catch basins. Removable catch basins may be useful in relatively high humidity environments, where the volume of water that condenses on surface 320 may exceed the volume of catch basin 156.

As an example, and without limitation, catch basins 156 and 158 may each have a volume of approximately 1.2 cubic centimeters (cc). In a situation where ECS 102 is enclosed within a volume of approximately 10 cm×10 cm×10 cm, at a temperature of approximately 35 C, and a relative humidity (RH) of 90%, the amount of water present is approximately 0.05 cc.

Figure 5:
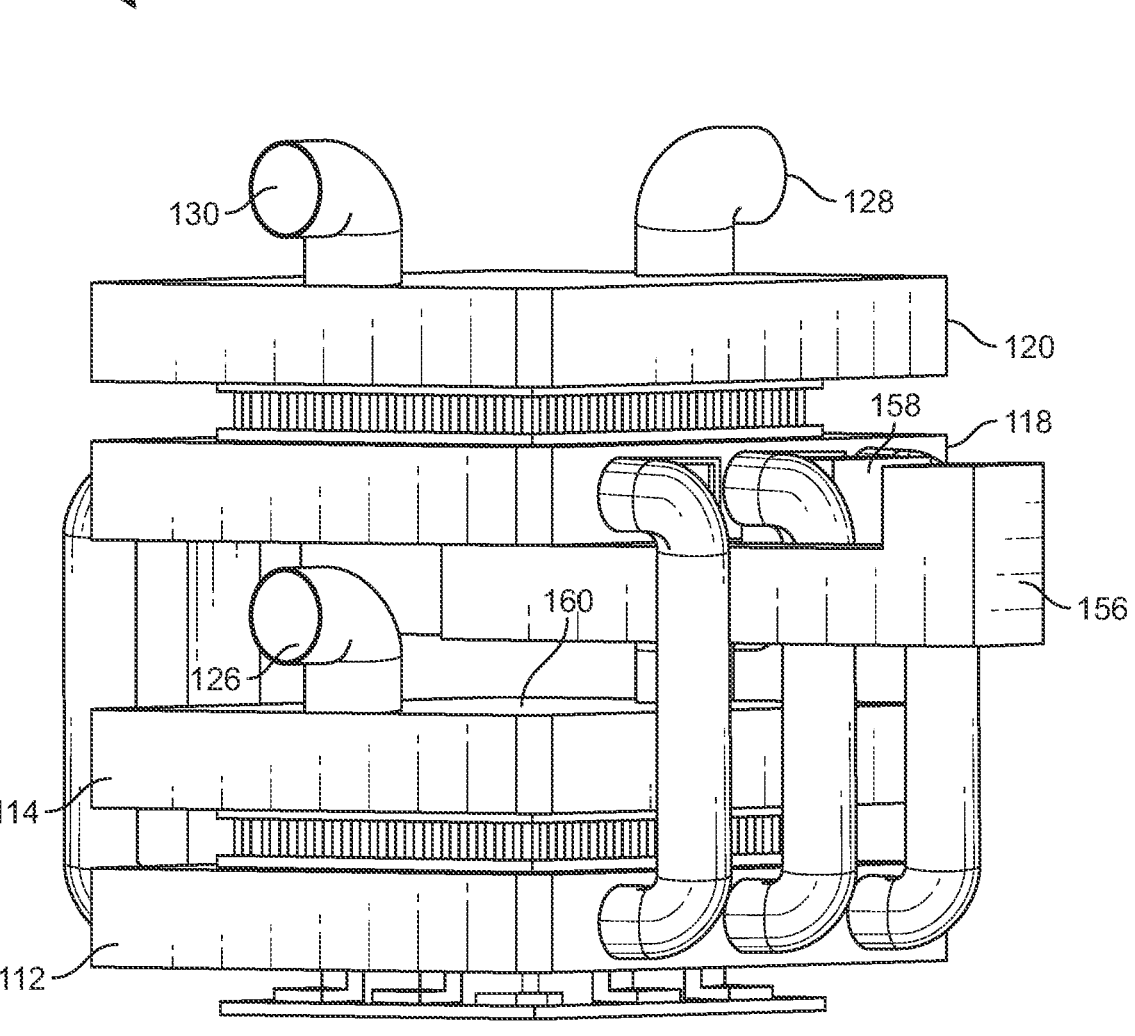
FIG. 5 illustrates multiple catch basins slideably inserted within a gap of the ECS, according to an embodiment.

FIG. 5 illustrates ECS 102, according to an embodiment. In the example of FIG. 5, catch basins 156 and 158 are slideably removeable from the gap 160 between lower TEC system 108 and upper TEC system 110. Catch basins 156 and 158 may rest on an upper surface of lower TEC system 108. Alternatively, catch basins 156 and 158, and cold plate 118 may include matching grooves and/or ledges that guide catch basins 156 and 158 as they slide into and out of gap 160, examples of which are provided below.

Figure 6:
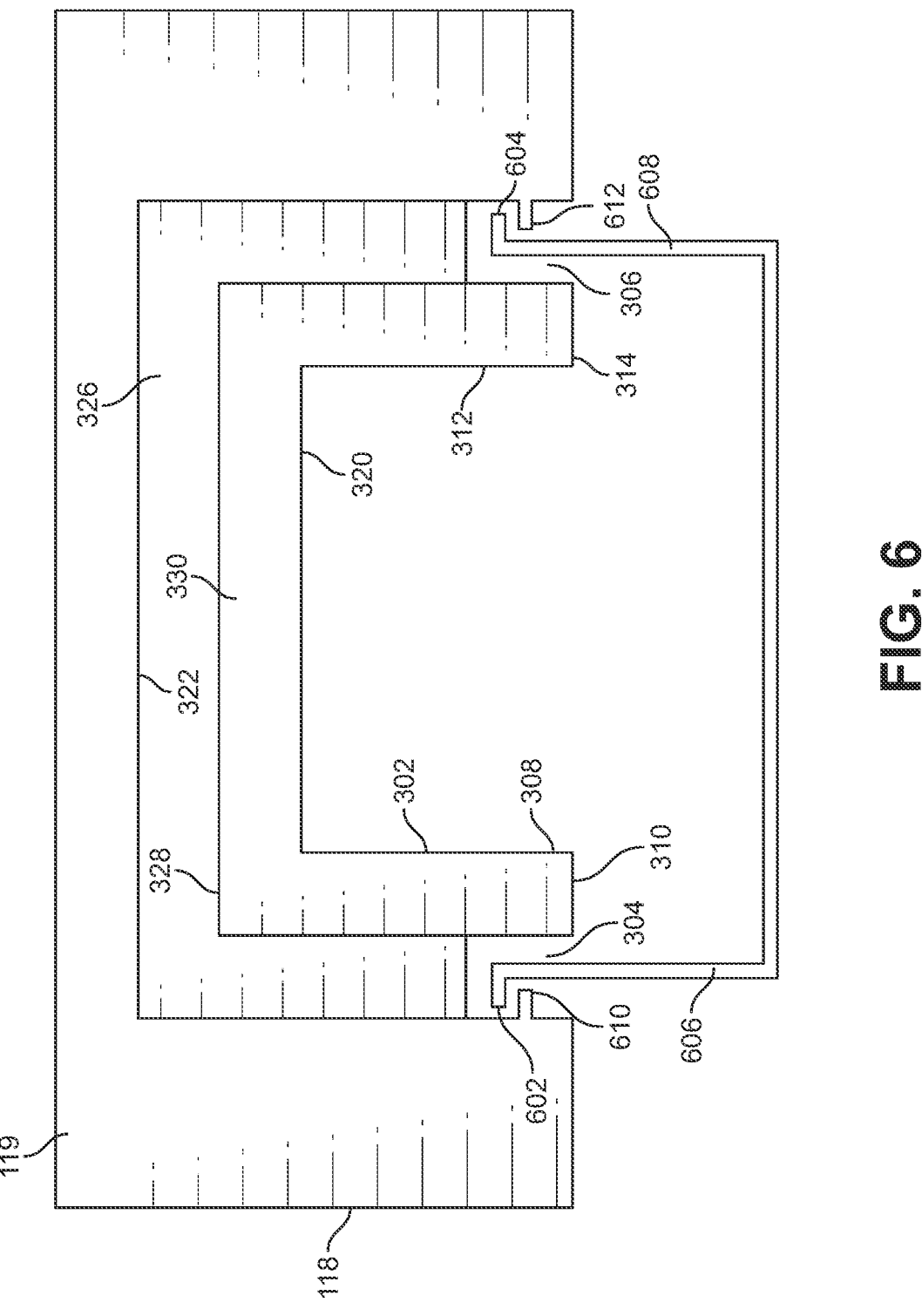
FIG. 6 illustrates a first one of the catch basins slideably inserted within the gap of the ECS, according to an embodiment.

FIG. 6 illustrates cold plate 118 and catch basin 156, according to an embodiment. In FIG. 6, catch basin 156 includes lips 602 and 604 that extend perpendicularly from side walls 606 and 608, and cold plate 118 includes corresponding ledges 610 and 612 that extent into recessed channels 304 and 306. In the example of FIG. 6, lips 602 and 604 rest on ledges 610 and 612.

Figure 7:
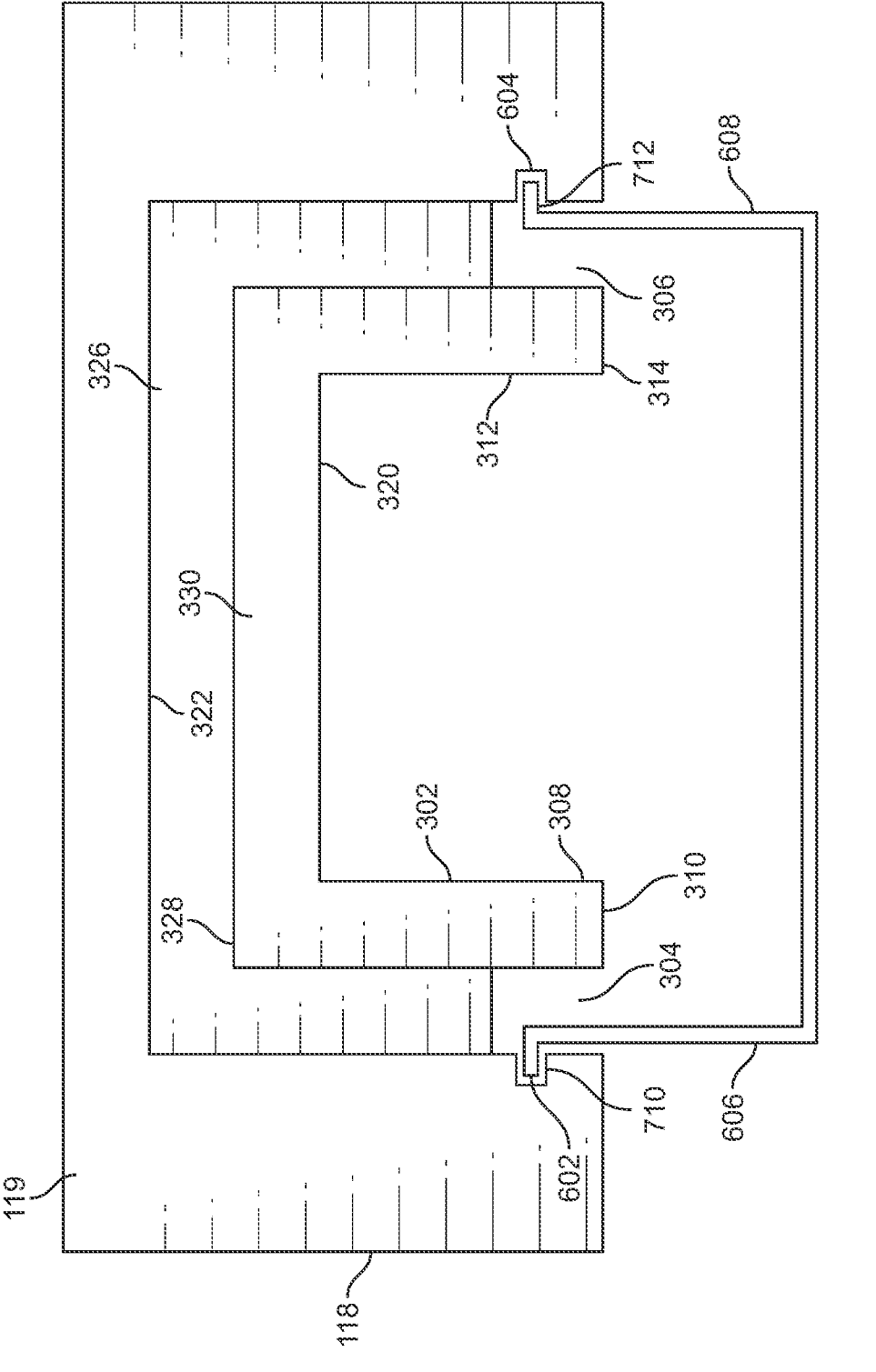
FIG. 7 illustrates the first catch basin slideably inserted within the gap of the ECS, according to another embodiment.

FIG. 7 illustrates cold plate 118 and catch basin 156, according to another embodiment. In FIG. 7, catch basin 156 includes lips 602 and 604, described above with reference to FIG. 6. Cold plate 118 includes corresponding grooves 710 and 712 in walls of recessed channels 304 and 306. In the example of FIG. 7, lips 602 and 604 slide within grooves 710 and 712.

Figure 8:
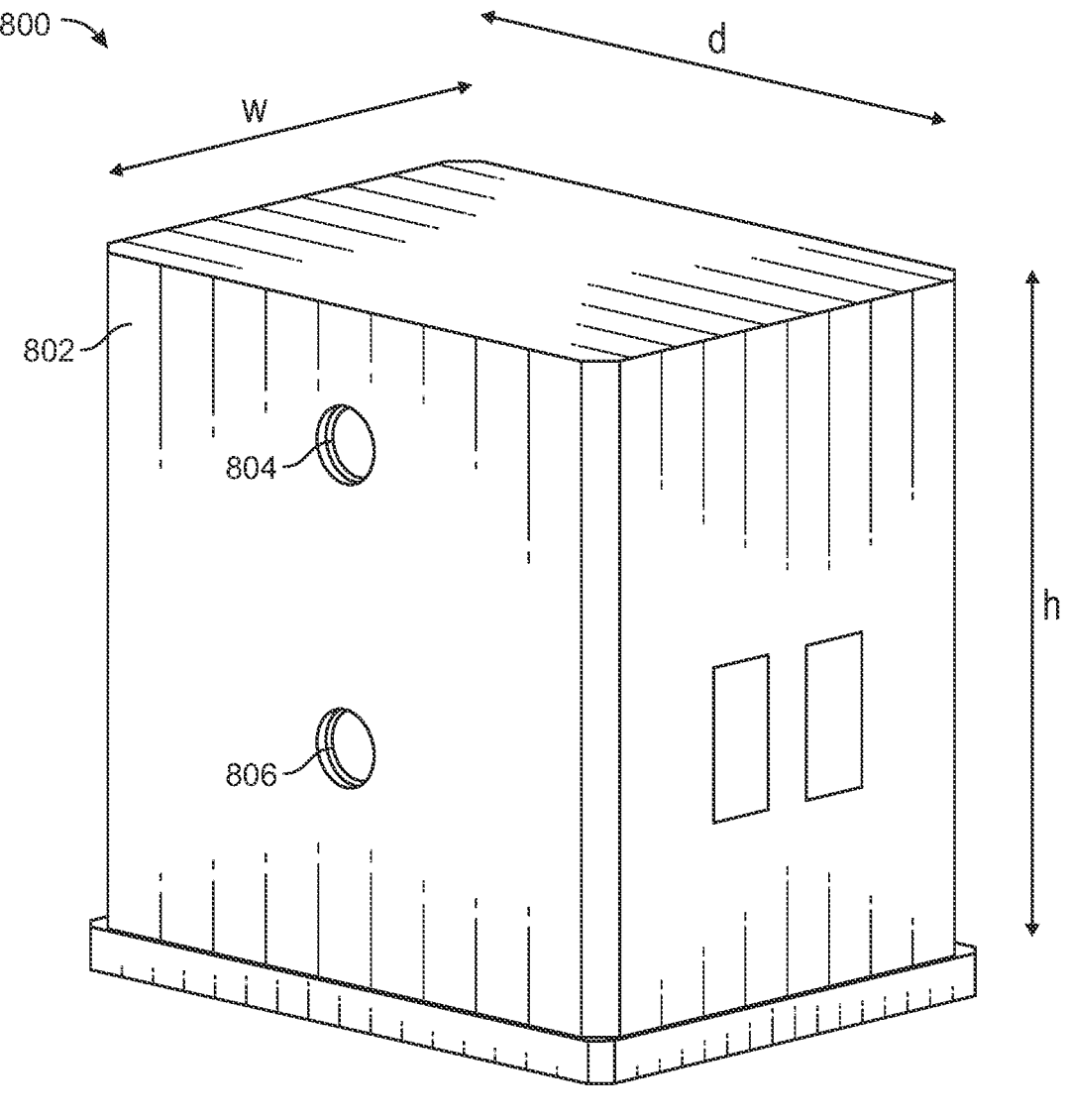
FIG. 8 illustrates an enclosure for the ECS, according to an embodiment.

System 100 may further include an enclosure that encloses ECS 102 over IC device 104. An enclosure may be useful to define a relatively small volume of space from which moisture may condense. FIG. 8 illustrates an enclosure 800, according to an embodiment. In the example of FIG. 8, a wall 802 of enclosure 800 has openings 804 and 806 for fluid outlets 126 and 130. An opposing wall of enclosure 800 may have similar openings for fluid inlets 124 and 128. A wall 808 of enclosure 800 has an opening 810 for catch basin 156 and an opening 812 for catch basin 158. System 100 may further include a gasket 814 positioned between enclosure 800 and IC device 104 or circuit card 106. Dimensions of enclosure 800 may be selected based on a dimensions of IC device 104 and/or circuit card 106. In an example, and without limitation, enclosure 800 has a height h of approximately 80 millimeters (mm), a depth of approximately 80 mm, and a width of approximately 60 millimeters.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s). While the foregoing is directed to specific examples, other and further examples may be devised without departing from the basic scope thereof, and the scope thereof is determined by the claims that follow.

What is claimed is:

1. An environmental control system (ECS) for an integrated circuit (IC) device, comprising:
first and second thermo-electric cooler (TEC) systems arranged in a stacked configuration such that the first TEC system is positioned between the IC device and the second TEC system;
wherein an IC-facing surface of the second TEC system has first, second, and third recessed channels;
wherein a wall between the first and second recessed channels defines a first rib; and
wherein a wall between the first and third recessed channels defines a second rib.

2. The ECS of claim 1, wherein:
the first TEC system comprises a first cold plate, a first fluid container, and a first TEC disposed therebetween;
the second TEC system comprises a second cold plate, a second fluid container, and a second TEC disposed therebetween;
a heat pipe having a first end disposed within an opening of the first cold plate and a second end disposed within an opening of the second cold plate; and
the IC-facing surface of the second TEC system corresponds to an IC-facing surface of the second cold plate.

3. The ECS of claim 1, wherein:
the first recessed channel is configured such that a surface of the first recessed channel is cooler than the IC-facing surface of the second TEC system when the second TEC system is operating.

4. The ECS of claim 1, wherein the first and second ribs are configured to drip water that condenses on a surface of the first recessed channel, away from the IC-facing surface of the second TEC system when the IC-facing surface is oriented horizontally.

5. The ECS of claim 4, wherein the second and third recessed channels are configured to preclude the water from flowing from the first and second ribs to the IC-facing surface of the second TEC system when the IC-facing surface is oriented horizontally.

6. The ECS of claim 1, wherein:
the first recessed channel extends to an opening in a second surface of the second TEC system;
the second surface is adjacent to the IC-facing surface;
the second surface has a fourth recessed channel;
the fourth recessed channel has a contour of the opening; and
a wall between the fourth recessed channel and the opening defines a third rib.

7. The ECS of claim 6, wherein the third rib is configured to drip water that condenses on a surface of the first recessed channel, away from the second surface, when the IC-facing surface and the first recessed channel are oriented vertically.

8. The ECS of claim 6, wherein the fourth recessed channel is configured to preclude water from flowing from the third rib to the second surface, when the IC-facing surface and the first recessed channel are oriented vertically.

9. The ECS of claim 6, further comprising a catch basin configured to catch and retain water that drips from the first and second ribs when the IC-facing surface is oriented horizontally, and to catch and retain water that drips from the third rib when the IC-facing surface and the first recessed channel are oriented vertically.

10. The ECS of claim 9, wherein the catch basin is removeably and slideably disposed within a gap between the first and second TEC systems.

11. The ECS of claim 1, further comprising:
an enclosure configured to enclose the first and second TEC systems therein, wherein the enclosure has an opening dimensioned to fit over the IC device.

12. The ECS of claim 11, wherein:
the first and second TEC systems have respective fluid inlets and fluid outlets; and
the enclosure further has corresponding fluid inlet pipe openings and fluid outlet pipe openings.

13. The ECS of claim 1, wherein the first and second TEC system have respective fluid inlets and fluid outlets, further comprising:
a heat exchanger system comprising a fluid pump and a heat exchanger;
fluid inlet pipes configured to provide fluid inlet paths from the heat exchanger system to the fluid inlets of the first and second TEC systems; and
fluid outlet pipes configured to provide fluid outlet paths from the fluid outlets of the first and second TEC systems to the heat exchanger system.

14. A computing device, comprising:
a circuit card; and
an environmental control system disposed over an integrated circuit (IC) device of the circuit card, comprising first and second thermo-electric cooler (TEC) systems arranged in a stacked configuration such that the first TEC system is positioned between the IC device and the second TEC system;

wherein an IC-facing surface of the second TEC system has first, second, and third recessed channels;

wherein a wall between the first and second recessed channels defines a first rib; and wherein a wall between the first and third recessed channels defines a second rib.

15. The computing device of claim 14, wherein:

the first recessed channel is configured such that a surface of the first recessed channel is cooler than the IC-facing surface of the second TEC system when the second TEC system is operating;

the first and second ribs are configured to drip water that condenses on the surface of the first recessed channel, away from the IC-facing surface of the second TEC system, when the IC-facing surface is oriented horizontally; and the second and third recessed channels are configured to preclude the water from flowing from the first and second ribs to the IC-facing surface of the second TEC system, when the IC-facing surface is oriented horizontally.

16. The computing device of claim 14, wherein:

the first recessed channel extends to an opening in a second surface of the second TEC system;

the second surface is adjacent to the IC-facing surface;

the second surface has a fourth recessed channel;

the fourth recessed channel has a contour of the opening; and a wall between the fourth recessed channel and the opening defines a third rib.

17. The computing device of claim 16, wherein:

the third rib is configured to drip water that condenses on a surface of the first recessed channel, away from the second surface when the IC-facing surface and the first recessed channel are oriented vertically; and the fourth recessed channel is configured to preclude the water from flowing from the third rib to the second surface when the IC-facing surface and the first recessed channel are oriented vertically.

18. The computing device of claim 16, further comprising a catch basin configured to catch and retain water that drips from the first and second ribs when the IC-facing surface is oriented horizontally, and to catch and retain water that drips from the third rib when the IC-facing surface and the first recessed channel are oriented vertically.

\* \* \* \* \*